United States Patent [19]

Miyazaki

[11] Patent Number: 4,937,655
[45] Date of Patent: Jun. 26, 1990

[54] FILM SEGMENT HAVING INTEGRATED CIRCUIT CHIP BONDED THERETO AND FIXTURE THEREFOR

[75] Inventor: Tatsuya Miyazaki, Kawasaki, Japan

[73] Assignee: Fujitsu Limited, Kawasaki, Japan

[21] Appl. No.: 253,461

[22] Filed: Oct. 5, 1988

[30] Foreign Application Priority Data

Oct. 5, 1987 [JP] Japan ................... 62-250997

[51] Int. Cl.⁵ ............................................ H01L 23/48
[52] U.S. Cl. ......................................... 357/70; 357/69
[58] Field of Search ............................. 357/70, 69, 74

[56] References Cited

U.S. PATENT DOCUMENTS

| | | | |
|---|---|---|---|
| 4,007,479 | 2/1977 | Kowalski | 357/70 |
| 4,069,496 | 1/1978 | Kowalski | 357/70 |
| 4,547,794 | 10/1985 | Tang | 357/70 |

Primary Examiner—James W. Davie
Attorney, Agent, or Firm—Armstrong, Nikaido, Marmelstein, Kubovcik & Murray

[57] ABSTRACT

A film segment has a flexible beam lead frame formed thereon, to which an IC chip is adapted to be bound in a wireless manner. The film segment having a rectangular shape is provided with at least two positioning perforations formed therein, each of which is adapted to receive and fit a positioning pin element, the positioning perforations being located along one of the diagonal lines of said film segment and in the vicinity of said flexible beam lead frame. The fixture is held by a fixture having a window encompassing the positioning perforations. The film segment can be positioned for testing the IC chip at a given test position with respect to the fixture by inserting the positioning pin elements into the positioning perforations through said window.

2 Claims, 3 Drawing Sheets

FILM SEGMENT HAVING INTEGRATED CIRCUIT CHIP BONDED THERETO AND FIXTURE THEREFOR

BACKGROUND OF THE INVENTION

(1) Field of the Invention

The present invention relates to a segment of a film strip having a flexible beam lead frame formed thereon, to which an integrated circuit (IC) chip is adapted to be bonded in a wireless manner, and also relates to a holder or fixture for holding the film segment with the IC chip, wherein the film segment can be positioned to test the IC chip at a given test position with respect to the fixture.

(2) Description of the Related Art

In the fabrication of an IC device, it is well known that an IC chip is bonded in a wireless manner to a flexible beam lead frame formed on a segment of a film strip, and also that such a film segment with the IC chip is detachably held by a holder or fixture to prevent the IC chip from being polluted or being damaged during handling and shipping thereof, as disclosed, for example, in U.S. Pat. No. 4,007,479 issued on Feb. 8, 1977, U.S. Pat. No. 4,069,496 issued on Jan. 17, 1978 (Re. 30,604 reissued on May 5, 1981), and U.S. Pat. No. 4,547,794 issued on Oct. 15, 1985.

In order to produce a film segment having a flexible beam lead frame formed thereon, a plurality of flexible beam lead frames are continuously formed or bound as a thin layer of a suitable electrical conductor such as copper, nickel, aluminum, or the like on a long film strip of a flexible material, which has the general appearance of a strip of motion picture film with sprocket perforations located along the lateral edges thereof, and then the long film strip is cut into segments so that each segment includes at least one lead frame.

When the film segment is held by the fixture, some of the sprocket perforations thereof are utilized so that the film segment is disposed in place with respect to the fixture. In particular, the fixture has some protrusions which are adapted to be inserted into some of the sprocket perforations located along the lateral edges of the film segment. By inserting the protrusions into the sprocket perforations, the film segment is held in place by the fixture. Note that since the protrusions are loosely inserted into the sprocket, the film segment is somewhat movable with respect to the fixture.

While the film segment is held by the holder, the IC chip bonded thereto is tested by electrically contacting pin-like probes to terminals or conductor pads of the lead frame, which are located on the film segment at closely spaced points. In testing, the film segment must be precisely positioned at a given test position with respect the fixture held at a fixed position, so that all of the pin-like probes can be properly contacted to the pads of the lead frame. Of course, unless proper contacts can be obtained between the pin-like probes and the pads, respectively, it is impossible to adequately carry out the test.

Some of the sprocket perforations of the film segment are also utilized to position the film segment at the given test position. In particular, the fixture has at least two access openings formed therein, which are aligned with two sprocket perforations of the film segment which are located along the lateral edges thereof, respectively, and which are not occupied by the protrusions used to hold the film segment by the fixture. By inserting two positioning pin elements into these sprocket perforations through the access openings, the film segment is positioned at the given test position with respect to the fixture, with the fixture being supported in a fixed position.

However, utilization of the sprocket perforations of the film segment should be avoided for the reason that high precision may be expected in positioning the film segment at the given test position. In particular, when the plurality of flexible beam lead frames are continuously formed or bound on the long film strip, and when the long film strip is cut into film segments, the long film strip is fed by engaging the sprocket perforations thereof with drive sprockets, in the same way as a motion picture film is driven. Thus, the film edges forming the sprocket perforations of the film strip may be subjected to plastic deformation due to the engagement of the perforation with the sprockets. This is because it is not expedient to utilize the sprocket perforations of the film segment for the positioning of the film segment at the given test position.

In addition, when the positioning pin elements are inserted into the sprocket perforations of the film segment through the access openings of the fixture, the film segment may be resiliently deflected. This is because the film segment is loosely held by the fixture, and because the sprocket perforations of the film segment which are located along the lateral edges thereof are spaced apart from the conductor pad zone by a distance great enough to cause the film segment to be resiliently deflected. Of course, deflection of the film segment decreased the positioning precision.

SUMMARY OF THE INVENTION

Accordingly, it is an object of the present invention to provide a segment of a film strip having a flexible beam lead frame formed thereon, to which an integrated circuit (IC) chip is adapted to be bonded in a wireless manner, and having at least two positioning perforations formed therein, which are so arranged that the film segment is able to be precisely positioned for testing the IC chip at a given test position with respect to a fixture by which the film segment is held.

It is also an object of the present invention to provide a holder or fixture for holding the film segment with the IC chip as mentioned above, wherein the film segment is able to be precisely positioned for testing the IC chip at a given test position with respect to the fixture by means of the positioning perforations formed in the film segment.

In accordance with the present invention, there is provided a film segment for carrying with an integrated circuit chip, which comprises a film segment body having a rectangular shape with four sides and a plurality of sprocket perforations formed therein, the sprocket perforations being located close to two opposing edges of the four side edges of the film segment body and being in parallel with the two opposing side edges thereof, the film segment body having an opening formed in a central portion thereof. The film segment further comprises a lead pattern including a plurality of lead elements formed on the film segment body, the lead elements each including an outer portion secured to the film segment body and an inner portion extending into the interior zone of the central opening. The integrated circuit chip is bonded to the inner portions of the lead elements so that the integrated circuit chip is substantially disposed within the interior zone of the central opening. The lead pattern includes a plurality of conductor pads which are electrically connected to the lead elements, respectively, the conductor pads being formed in rows on a zone of the film segment body which is set around the central opening and inside of the sprocket perforations. The film segment body has at least two positioning perforations formed therein, which are disposed in the vicinity of the conductor pads so that each of the positioning perforations are included in the rows of the conductor pads.

In accordance with the present invention, there is also provided a fixture for holding the film segment as mentioned above, which comprises a fixture body having a recess formed therein for receiving the film segment, the fixture body having a window formed in the bottom of the recess. The fixture further comprises at least two protrusions projecting from a marginal zone of the bottom of the recess for engaging with the sprocket perforations upon receiving the film segment in the recess. The window is sized so as to encompass the positioning perforations and the conductor pads formed in and on the film segment body and the window is smaller than the film segment body.

BRIEF DESCRIPTION OF THE DRAWINGS

The present invention will become more apparent in the detailed description, in connection with the accompanying drawing, in which.

DESCRIPTION OF THE PREFERRED EMBODIMENT

Figure 1:
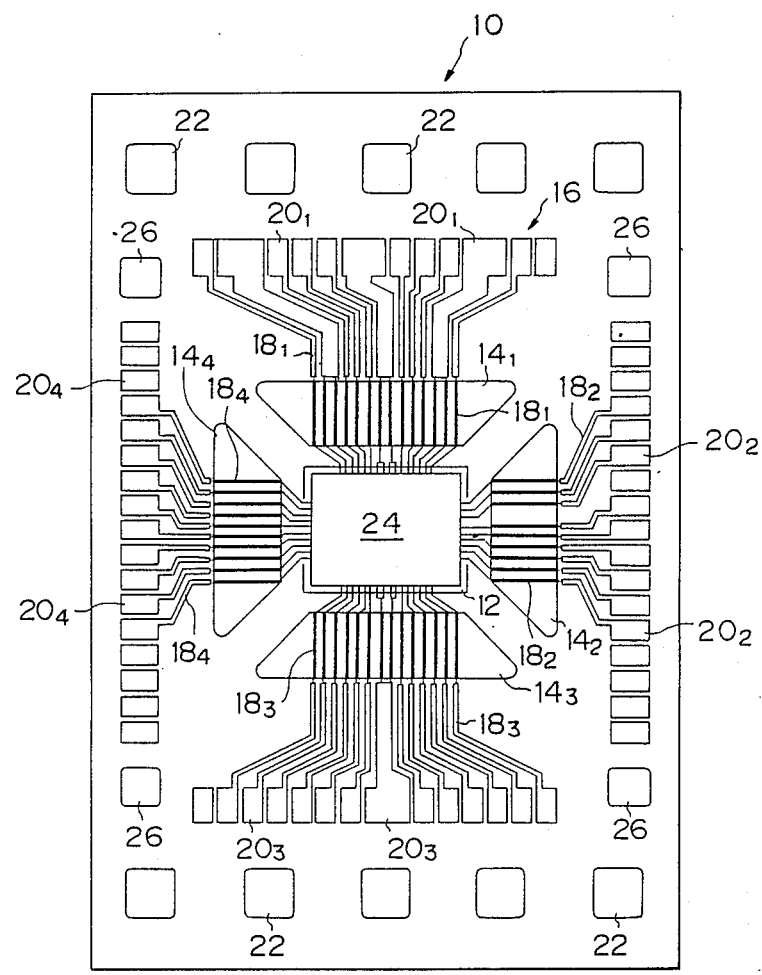
FIG. 1 is a plan view of a film segment according to the present invention, which has an integrated circuit bound thereto in a wireless manner.

Referring to FIG. 1, a film segment, which is generally designated by a reference numeral 10, comprises a film segment body made of a suitable flexible material and has a rectangular and flat shape. The film segment 10 has a central rectangular opening 12 formed therein and four trapezoid openings $14_1$, $14_2$, $14_3$ and $14_4$ formed and disposed along the four side edges of the central rectangular opening 12.

The film segment 10 also has a flexible beam lead pattern of frame formed thereon, which is generally designated by a reference numeral 16 and which includes a plurality of conductors or lead elements extending from the four side edges of the central opening 12 toward the four side edges of the film segment 10, respectively. Each of the lead elements includes an outer portion secured to the film segment body and an inner portion extending into the interior zone of the opening 12. The plurality of lead elements may be classified into four groups: a first group of lead elements $18_1$ transversing the trapezoid opening $14_1$; a second group of lead elements $18_2$ transversing the trapezoid opening $14_2$; a third group of lead elements $18_3$ transversing the trapezoid opening $14_3$; and a fourth group of lead elements $18_4$ transversing the trapezoid opening $14_4$. The first group of lead elements $18_1$ terminates in a row of contact pads $20_1$; the second group of lead elements $18_2$ in a row of contact pads $20_2$; the third group of lead elements $18_3$ in a row of contact pads $20_3$; and the fourth group of lead elements $18_4$ in a row of contact pads $20_4$. Each of the rows of contact pads $20_1$, contact pads $20_2$, lead elements $18_3$ and contact pads $20_4$ is in parallel with the corresponding side edge of the film segment 10 so that the four rows forms a rectangle, as shown in FIG. 1.

The film segment 10 may be produced by the same method as mentioned above. That is, a plurality of flexible beam lead frames are continuously formed or bound as thin layer of a suitable electrical conductor such as copper, nickel, aluminum, or the like on a long film strip of flexible material, which has the general appearance of a strip of motion picture film with sprocket perforations located along the lateral edges thereof, and then the long film strip is cut into segments so that each segment includes at least one lead frame. Accordingly, the film segment 10 has two rows of sprocket perforations 22 located along the upper and lower side edges (FIG. 1) thereof. The lead frame 16 is preferably formed by a conventional photoetching process.

In FIG. 1, an integrated circuit (IC) chip, which is designated by a reference numeral 24, is received within the central rectangular opening 12 and is electrically bonded to the lead frame 16 in a wireless manner. In particular, the IC chip 24 is bonded to the inner portions of the lead elements $18_1$, $18_2$, $18_3$ and $18_4$ which extend into the interior zone of the opening 12, so that the IC chip 24 is substantially disposed within the opening 12.

In the embodiment of FIG. 1, the film segment 10 features four positioning perforations 26 which are used to position the film segment 10 at a given test position for testing the IC chip 24 bonded thereto and which are disposed at four corners of the rectangle formed by the four rows of conductor pads $20_1$, $20_2$, $20_3$ and $20_4$. In other words, the positioning perforations 26 are disposed so that they are included in the rows of conductor pads. A function of the positioning perforations 26 will be explained in more detail hereinafter.

Figure 2:
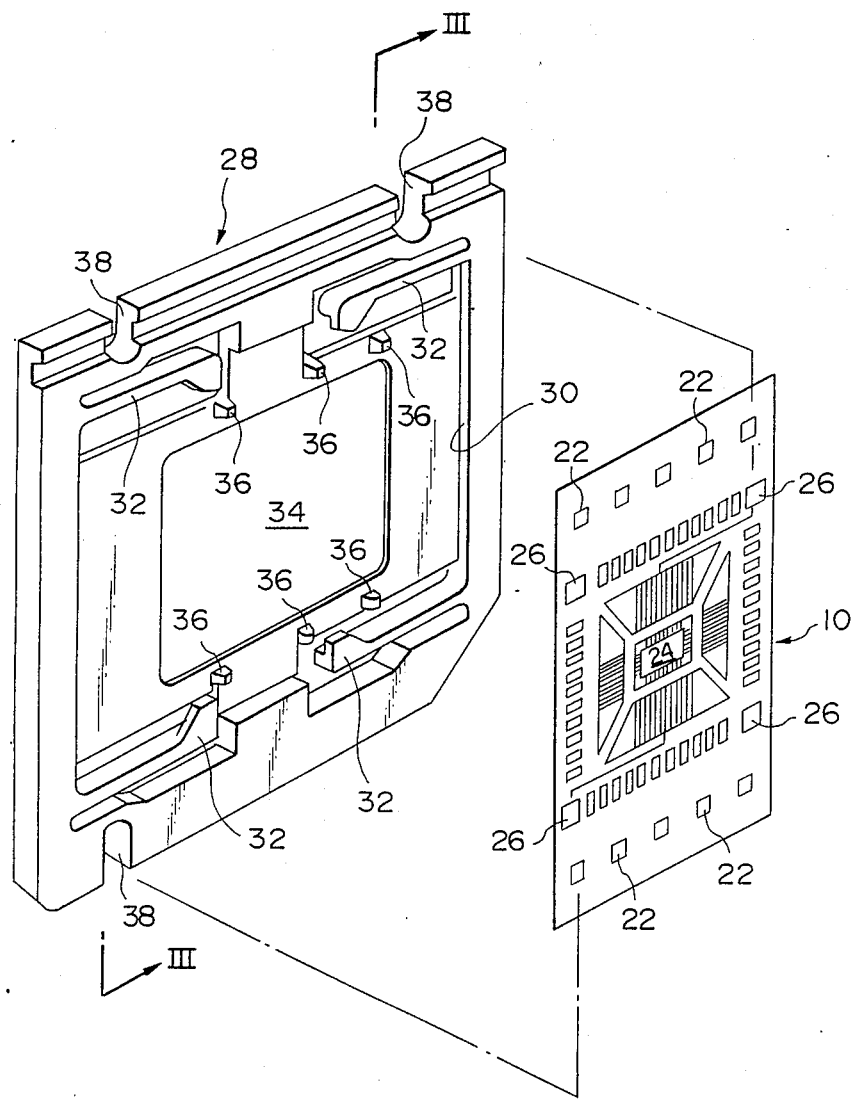
FIG. 2 is a perspective view showing the film segment of FIG. 1 together with a holder or fixture therefor.

Referring to FIG. 2, the film segment 10 is shown together with a holder or a fixture 28 by which the film segment 10 is detachably held to prevent the film segment 10 with the IC chip 24 from being polluted and being damaged during handling and shipping. The fixture 28 comprises a fixture body which may be integrally formed of a suitable synthetic resin, and has a rectangular recess 30 formed therein for receiving the film segment 10. As shown in FIG. 2, the fixture 28 is provided with four arms 32 which are disposed at the corners of the rectangular recess 30. In particular, at the corners of the rectangular recess 30, the arms 32 integrally extend from one pair of opposing side walls partially defining the recess 30 so as to be in parallel with the other pair of opposing side walls also partially defining the recess 30. The arms 32 are thin enough to deform easily and resiliently so that the arms 32 can be moved out of the recess 30 when the film segment 10 is received therein. Once the film segment 10 is received in the recess 30, the arms 32 are resiliently returned to the original position shown in FIG. 2, whereby the film segment 10 is securely held in the recess 30 by the arms 32.

As can be seen in FIG. 2, the fixture 28 has a window 34 formed in the bottom of the recess 30, and six protrusions 36 projecting from a marginal zone of the bottom of the recess, three of them being located along the upper lateral edge of the window 34 and the other three protrusions along the lower lateral edge thereof. When the film segment 10 is received in the recess 30 as mentioned above, the protrusions 36 are inserted into the sprocket perforations 22 so that the film segment 10 is held in place within the recess 30. However, since the protrusions 36 are loosely inserted into the sprocket perforations 22, the film segment 10 is somewhat movable with respect to the fixture 28. It should be noted that the window 34 has a rectangular size which is larger than that of the rectangle formed by the four rows of conductor pads $20_1$, $20_2$, $20_3$ and $20_4$ so that the four positioning perforations 26 together with all the contact pads are encompassed by the window 34.

The fixture 28 also has notches 38 formed in the upper and lower edges thereof, which are used to support the fixture 28 in place by an IC test equipment (not shown).

Figure 3:
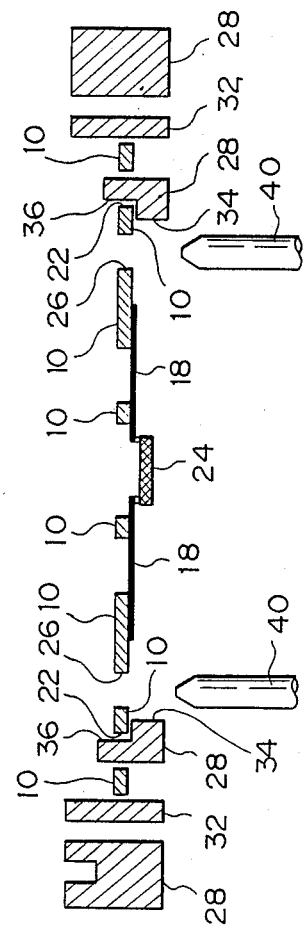
FIG. 3 is a sectional view taken along lines III—III of FIG. 2, the film segment being held by the fixture.

FIG. 3 just shows a condition that the fixture 28 having the film segment 10 held thereby is supported in place by such an IC test equipment. Before the IC chip 24 is tested by the IC test equipment, the film segment 10 with the IC chip 24 must be precisely positioned at a given test position with respect to the fixture 28 supported by the IC test equipment. This positioning is carried out by inserting four positioning pin elements 40 (which form a part of the IC test equipment) into the four positioning perforations 26 through the window 34, as shown in FIG. 3. The positioning pin elements 40 are sized so that each pin element 40 fits the positioning perforation 26, whereby when a tapered tip of each pin element 40 clears the perforation 26, the film segment 10 becomes positioned at the given test position with respect the fixture 28, and hence the IC test equipment. After the positioning is completed, pin-like probes (not shown) of the IC test equipment access the conductor pads through the window 34 and then are electrically contacted therewith for testing the IC chip 24.

As is apparent from the foregoing, according to the present invention, since the positioning perforations are prevented from being subjected to any mechanical effect until the positioning pin elements are inserted thereinto, it can be insured that the film segment is more precisely positioned at the given test position. Also, the film segment can be kept from being resiliently deflected upon the positioning of the film segment because the positioning perforations are disposed in the vicinity of the conductor pad zone, whereby the positioning precision is further increased.

Although it is preferable that the film segment is provided with the four positioning perforations, as mentioned above, the film segment may have only two of the four positioning perforations which are located along one of the diagonal lines of the film segment, if necessary.

In the embodiment mentioned above, although the positioning perforations are square, they may have any other shape such as circular, rectangular, or oval.

It should be understood by those skilled in the art that the foregoing description is a preferred embodiment of the invention and that various changes and modifications may be made in the invention without departing from the spirit and scope thereof.

I claim:

1. A circuit chip device, comprising:

an integrated circuit chip;

a film segment for carrying said integrated circuit chip, said film segment including: (a) a film segment body having a substantially rectangular shape, said film segment body having a central opening passing through a center portion thereof, and (b) a plurality of sprocket perforations passing therethrough, said sprocket perforations arranged in two rows, one row of said sprocket perforations being located near one of two opposing side edges of said film segment body, the other row of said sprocket perforations being located near an opposing side edge of said film segment body, and said two rows of said sprocket perforations being in parallel with said two opposing side edges of said film segment body; and a lead pattern having a plurality of lead elements formed on said film segment body, each of said lead elements including an outer portion secured to said film segment body and an inner portion extending into said central opening, said integrated circuit chip being bonded to each of said lead element inner portion so that said integrated circuit chip is substantially disposed within said central opening, said lead pattern further having a plurality of conductor pads electrically and respectively connected to said plurality of lead elements, said conductor pads being formed in rows in said film segment body for surrounding said central opening, wherein said rows of conductor pads are formed within a region in said film segment body between said rows of sprocket perforations and said central opening, wherein said film segment body further has at least two positioning perforations passing therethrough substantially aligned with each of said rows formed by said plurality of conductor pads.

2. The circuit chip device as in claim 1, further comprising:

a fixture means for holding said film segment, said fixture means including: (a) a fixture body having a recess with a bottom portion formed thereon for receiving said film segment, said fixture body having a window passing through said bottom portion of said recess, and (b) at least two projections extending from a said bottom portion of said recess for respectively accommodating therein said plurality of sprocket perforations, wherein said window is smaller than said film segment body, and is formed so as to receive therein said plurality of said positioning perforations and said plurality of conductor pads.

* * * * *